US012418281B2

United States Patent
Khawas et al.

(10) Patent No.: US 12,418,281 B2
(45) Date of Patent: Sep. 16, 2025

(54) LOW AREA AND POWER MULTI-BIT FLIP-FLOP

(71) Applicant: TEXAS INSTRUMENTS INCORPORATED, Dallas, TX (US)

(72) Inventors: Arnab Khawas, Bangalore (IN); Madhavan Pissay, Hyderabad (IN); Badarish Subbannavar, Bangalore (IN)

(73) Assignee: Texas Instruments Incorporated, Dallas, TX (US)

(*) Notice: Subject to any disclaimer, the term of this patent is extended or adjusted under 35 U.S.C. 154(b) by 0 days.

(21) Appl. No.: 18/425,722

(22) Filed: Jan. 29, 2024

(65) Prior Publication Data

US 2025/0247082 A1 Jul. 31, 2025

(51) Int. Cl.
*H03K 3/012* (2006.01)
*G01R 31/3177* (2006.01)
*H03K 3/3562* (2006.01)

(52) U.S. Cl.
CPC ..... *H03K 3/35625* (2013.01); *G01R 31/3177* (2013.01); *H03K 3/012* (2013.01)

(58) Field of Classification Search
CPC .. H03K 3/012; H03K 3/0372; H03K 3/35625; G01R 31/3177
See application file for complete search history.

(56) References Cited

U.S. PATENT DOCUMENTS

| 2017/0077909 A1* | 3/2017 | Maeno | G01R 31/318541 |
| 2021/0099161 A1* | 4/2021 | Rasouli | H03K 3/35625 |
| 2022/0239286 A1* | 7/2022 | Chien | H03K 3/0375 |

* cited by examiner

*Primary Examiner* — Patrick O Neill
(74) *Attorney, Agent, or Firm* — Xianghui Huang; Frank D. Cimino

(57) ABSTRACT

Embodiments disclosed herein relate to device testing using scan chains including various flip-flop devices in a multi-bit flip-flop configuration. A circuit device included herein includes a first flip-flop sub-circuit and a second flip-flop sub-circuit. The first flip-flop sub-circuit is coupled to receive a clock signal and an input, and the second flip-flop circuit is coupled to the first flip-flop sub-circuit. The first flip-flop sub-circuit includes an input sub-circuit, a first latch sub-circuit, a first latch tristate, a second latch sub-circuit, and a first output inverter. The second latch sub-circuit includes a first transmission gate, a first inverter, and a second inverter. The second flip-flop sub-circuit includes a second transmission gate, a first clock tristate, a third latch sub-circuit, a second latch tristate, a fourth latch sub-circuit, and a second output inverter. The fourth latch sub-circuit includes a third transmission gate, a third inverter, and a fourth inverter.

20 Claims, 3 Drawing Sheets

LOW AREA AND POWER MULTI-BIT FLIP-FLOP

TECHNICAL FIELD

This relates generally to multi-bit flip-flop circuits, and more particularly, to performing scan chain testing therewith.

BACKGROUND

In digital logic circuits, flip-flops and latches can be included to store state information and ensure proper sequencing for logic in electronics. The output of a flip-flop may transition (e.g., switch state from "0" to "1" and "1" to "0") at specific times determined based on the state of a clock signal. Outside of these times, the flip-flop retains its current state. In this way, a flip-flop stores state data, such as a "0" or "1" based on the state of the clock signal and the state of a data input.

As digital system functionality increases in complexity, individual standard cell area optimization for digital circuits, such as flip-flops and latches, becomes increasingly critical. To reduce design area and power consumption by digital circuits, existing solutions may include multi-bit flip-flops in place of single-bit flip-flops. Multi-bit flip-flops may be used to store multiple bit signals using a single clock signal, and thus, they can save area where multiple single-bit flip-flops may be used.

Problematically, however, various multi-bit flip-flops existing today, include significant numbers of transistors despite reducing design area relative to single-bit flip-flops. Therefore, existing architectures of multi-bit flip-flops may fail to realize power and area savings for increasingly complex digital systems.

SUMMARY

Various embodiments disclosed herein relate to multi-bit flip-flop circuits, and more particularly, to architecture of flip-flop circuits of multi-bit flip-flop circuits. In an example embodiment, a circuit device is provided. The circuit device includes a first flip-flop sub-circuit coupled to receive a clock signal and an input and a second flip-flop sub-circuit coupled to receive the clock signal and coupled to the first flip-flop sub-circuit. The first flip-flop sub-circuit comprises an input sub-circuit coupled to receive the clock signal and the input, a first latch sub-circuit coupled to receive the clock signal and coupled to the input sub-circuit, a first latch tristate coupled to receive the clock signal and coupled to the first latch sub-circuit, a second latch sub-circuit coupled to receive the clock signal and coupled to the first latch tristate, and a first output inverter coupled to the first latch tristate and to the second latch sub-circuit. The second latch sub-circuit includes a first transmission gate coupled to the first latch tristate, the first output inverter, and the second flip-flop sub-circuit, a first inverter coupled to the first transmission gate, and a second inverter coupled to the first inverter, the first latch tristate, and the first output inverter. The second flip-flop sub-circuit comprises a second transmission gate coupled to receive the clock signal and coupled to the first transmission gate of the second latch sub-circuit, a first clock tristate coupled to receive the clock signal and coupled to the second transmission gate, a third latch sub-circuit coupled to receive the clock signal and coupled to the clock tristate, a second latch tristate coupled to receive the clock signal and coupled to the third latch sub-circuit, a fourth latch sub-circuit coupled to receive the clock signal and coupled to the second latch tristate, and a second output inverter coupled to the second latch tristate and to the fourth latch sub-circuit. The fourth latch sub-circuit includes a third transmission gate coupled to the second latch tristate and the second output inverter, a third inverter coupled to the third transmission gate, and a fourth inverter coupled to the third inverter, the second latch tristate, and the second output inverter.

This Summary is provided to introduce a selection of concepts in a simplified form that are further described below in the Detailed Description. It may be understood that this Summary is not intended to identify key features or essential features of the claimed subject matter, nor is it intended to be used to limit the scope of the claimed subject matter.

BRIEF DESCRIPTION OF THE DRAWINGS

The drawings are not necessarily drawn to scale. In the drawings, like reference numerals designate corresponding parts throughout the several views. In some embodiments, components or operations may be separated into different blocks or may be combined into a single block.

DETAILED DESCRIPTION

Figure 1A:
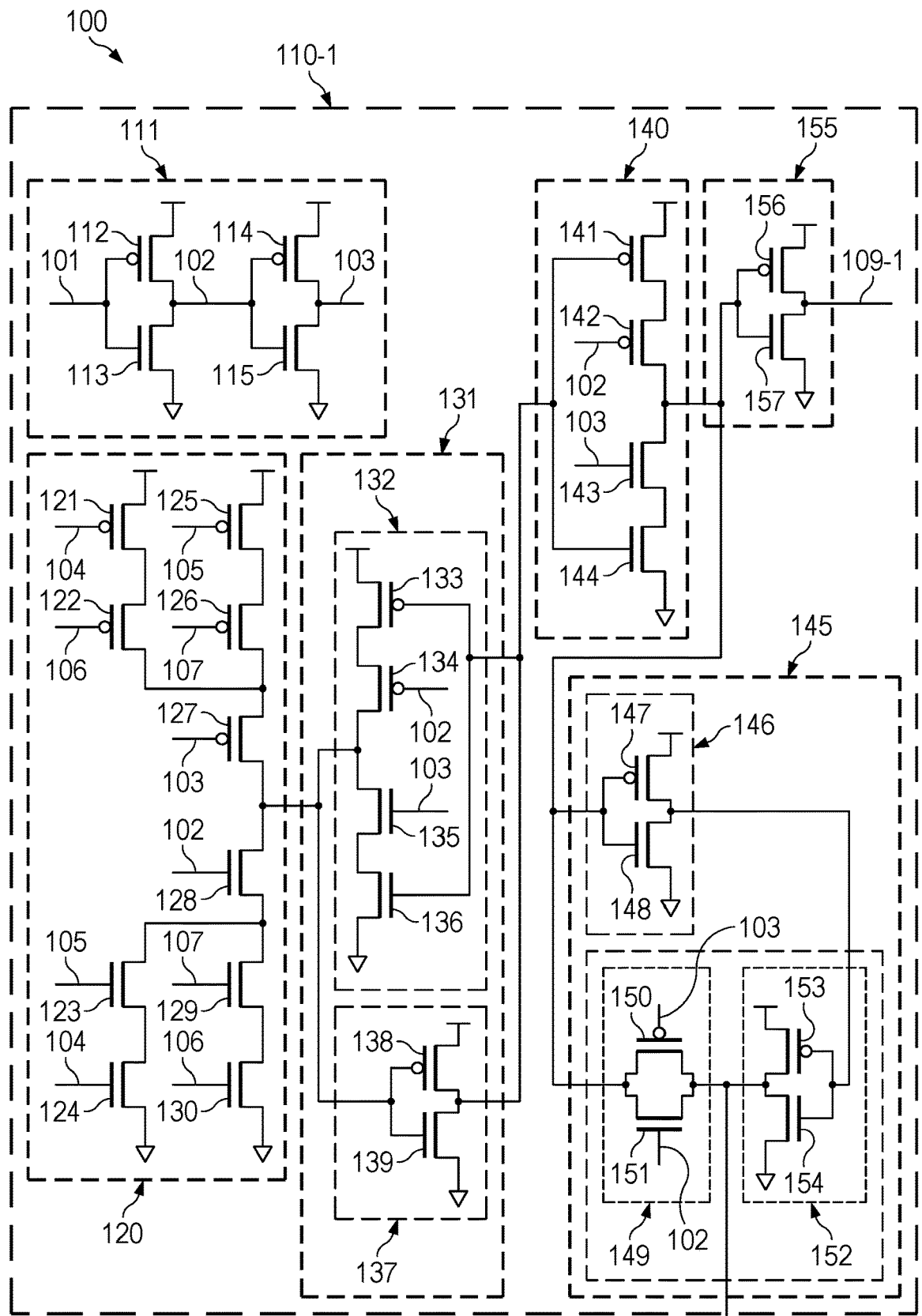
FIGS. 1A and 1B (collectively FIG. 1) illustrate an example multi-bit flip-flop circuit in accordance with an embodiment.

Embodiments of the present disclosure are described in specific contexts, such as in multi-bit flip-flop circuits, primary-secondary latch circuits, digital logic and inverter circuitry, and the like. Some embodiments may use other circuits, digital logic components, topologies, and applications that exhibit increased transistor efficiency and other characteristics based on decreasing the number of transistors in a system or circuit.

Discussed herein are enhanced components, systems, and architectures related to multi-bit flip-flop circuits used in digital systems or circuits to execute multiple bit-level operations on logic signals. In an electronic system, a flip-flop circuit can store logical states of inputs to the flip-flop circuit, such as scan data during a testing phase or input data during real-time operations. Flip-flops and latches are examples of logic components within digital circuitry that can store state data (e.g., "0" or "1") based on inputs to the flip-flops (e.g., an input data signal) at times dictated by a clock signal. Some example flip-flops include one or more inverters that can be triggered by a clock signal to store the state of the input data signal.

Multi-bit flip-flops may be included in a system to store such logical states among several different data inputs. Such multi-bit flip-flops may be tested by scan chaining several bits, or individual flip-flop circuits, of the multi-bit flip-flop circuit together. Scan data inputs may be provided to a first bit flip-flop circuit in the multi-bit flip-flop circuit and measured at an output node of the multi-bit flip-flop circuit to ensure accuracy, efficiency, and power consumption of the multi-bit flip-flop circuit. Problematically, however, multi-bit flip-flop circuits include significant numbers of transistors for both data storage and scan testing purposes, despite being more power and area conservative relative to multiple single-bit flip-flop circuits.

As disclosed herein, examples of a multi-bit flip-flop circuit are described that include a reduced number of transistors compared to existing multi-bit flip-flop circuit topologies. The multi-bit flip-flop circuit may include an input sub-circuit, primary and secondary latch sub-circuits, and an output inverter, among other components. In some examples, the secondary latch sub-circuits of each flip-flop bit in the multi-bit flip-flop circuit includes two inverters and a transmission gate, which may utilize a reduced number of transistors among the multi-bit flip-flop circuit. Additionally, each input sub-circuit from the second bit, or second stage, of the multi-bit flip-flop circuit until the last bit of an n-bit multi-bit flip-flop circuit may include a scan transmission gate for the scan data input as opposed to a scan input multiplexer, which may further reduce the number of transistors among the multi-bit flip-flop circuit. In this way, with respect to the input sub-circuits, the transistor count of the multi-bit flip-flop circuit may be reduced by $(n-1)*2$ transistors, where n is the number of bits or stages in the multi-bit flip-flop circuit. Advantageously, such a topology can reduce latency within the flip-flop circuit during scan testing, latency within an overall digital circuit that implements logic based on the data stored by the multi-bit flip-flop circuit, power consumption by the multi-bit flip-flop circuit, and design cost by avoiding large numbers of transistors.

In an example embodiment, a circuit device is provided. The circuit device includes a first flip-flop sub-circuit coupled to receive a clock signal and an input and a second flip-flop sub-circuit coupled to receive the clock signal and coupled to the first flip-flop sub-circuit. The first flip-flop sub-circuit comprises an input sub-circuit coupled to receive the clock signal and the input, a first latch sub-circuit coupled to receive the clock signal and coupled to the input sub-circuit, a first latch tristate coupled to receive the clock signal and coupled to the first latch sub-circuit, a second latch sub-circuit coupled to receive the clock signal and coupled to the first latch tristate, and a first output inverter coupled to the first latch tristate and to the second latch sub-circuit. The second latch sub-circuit includes a first transmission gate coupled to the first latch tristate, the first output inverter, and the second flip-flop sub-circuit, a first inverter coupled to the first transmission gate, and a second inverter coupled to the first inverter, the first latch tristate, and the first output inverter. The second flip-flop sub-circuit comprises a second transmission gate coupled to receive the clock signal and coupled to the first transmission gate of the second latch sub-circuit, a first clock tristate coupled to receive the clock signal and coupled to the second transmission gate, a third latch sub-circuit coupled to receive the clock signal and coupled to the clock tristate, a second latch tristate coupled to receive the clock signal and coupled to the third latch sub-circuit, a fourth latch sub-circuit coupled to receive the clock signal and coupled to the second latch tristate, and a second output inverter coupled to the second latch tristate and to the fourth latch sub-circuit. The fourth latch sub-circuit includes a third transmission gate coupled to the second latch tristate and the second output inverter, a third inverter coupled to the third transmission gate, and a fourth inverter coupled to the third inverter, the second latch tristate, and the second output inverter.

In another example embodiment, a circuit device is provided. The circuit device includes a first flip-flop sub-circuit coupled to receive a clock signal and an input, and a second flip-flop sub-circuit coupled to receive the clock signal and coupled to the first flip-flop sub-circuit. The first flip-flop sub-circuit comprises an input sub-circuit coupled to receive the clock signal and the input, a first latch sub-circuit coupled to receive the clock signal and coupled to the input sub-circuit, a first latch tristate coupled to receive the clock signal and coupled to the first latch sub-circuit, a second latch sub-circuit coupled to receive the clock signal and coupled to the first latch tristate, and a first output inverter coupled to the first latch tristate and to the second latch sub-circuit. The second latch sub-circuit includes a first transmission gate coupled to the first latch tristate, the first output inverter, and the second flip-flop sub-circuit, a first inverter coupled to the first transmission gate, and a second inverter coupled to the first inverter, the first latch tristate, and the first output inverter.

In yet another example embodiment, a circuit device is provided that includes a first flip-flop sub-circuit coupled to receive a clock signal and an input, and a second flip-flop sub-circuit coupled to receive the clock signal and coupled to the first flip-flop sub-circuit. The second flip-flop sub-circuit comprises a first transmission gate coupled to receive the clock signal and coupled to a first transmission gate of a first latch sub-circuit; a first transmission gate coupled to receive the clock signal and coupled to the first flip-flop sub-circuit, a first clock tristate coupled to receive the clock signal and coupled to the first transmission gate, a first latch sub-circuit coupled to receive the clock signal and coupled to the first clock tristate, a first latch tristate coupled to receive the clock signal and coupled to the first latch sub-circuit, a second latch sub-circuit coupled to receive the clock signal and coupled to the first latch tristate, and a first output inverter coupled to the first latch tristate and to the second latch sub-circuit. The second latch sub-circuit includes a second transmission gate coupled to the first latch tristate and the first output inverter, a first inverter coupled to the second transmission gate, and a second inverter coupled to the first inverter, the first latch tristate, and the first output inverter.

Figure 1B:
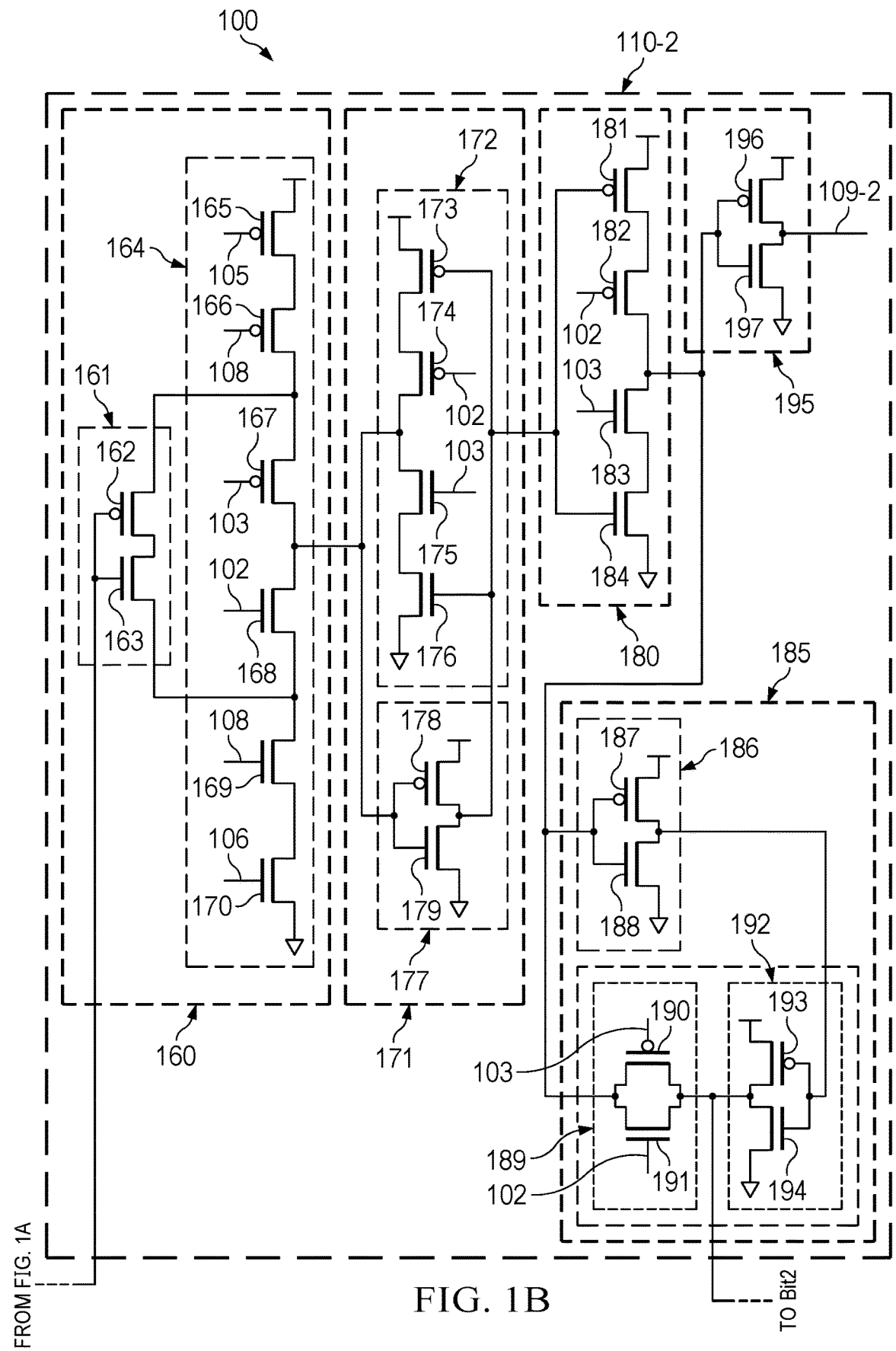

FIGS. 1A and 1B illustrate an example multi-bit flip-flop circuit in accordance with an embodiment. FIG. 1 includes multi-bit flip-flop circuit 100, which includes flip-flop circuit 110-1, flip-flop circuit 110-2, and clock buffer 111. Flip-flop circuit 110-1 further includes input sub-circuit 120, primary latch sub-circuit 131, latch clock tristate 140, secondary latch sub-circuit 145, and output inverter 155. Flip-flop circuit 110-2 further includes input sub-circuit 160, primary latch sub-circuit 171, latch clock tristate 180, secondary latch sub-circuit 185, and output inverter 195.

Multi-bit flip-flop circuit 100 may be representative of a two-bit flip-flop circuit capable of resolving multiple bit-level signals (input functional data 107 and input functional data 108) provided by a digital circuit, for example, based on clock signal 101 provided by clock buffer 111. Each bit of multi-bit flip-flop circuit 100, or flip-flop circuit 110-1 and flip-flop circuit 110-2, may be used to store a state (e.g., "0", "1") of an input signal and provide the stored state data downstream to subsequent bits of multi-bit flip-flop circuit 100. Accordingly, multi-bit flip-flop circuit 100 may be used to provide power improvements and area reduction, among other benefits, of a digital system.

Multi-bit flip-flop circuit 100 includes flip-flop circuit 110-1, flip-flop circuit 110-2, and clock buffer 111. Flip-flop circuit 110-1 may include a set of inputs coupled to receive inverted clock signal 102 and clock signal 103 from clock buffer 111, scan data 104, scan enable signal 105, and inverted scan enable signal 106, and input functional data 107. Flip-flop circuit 110-1 may include an output to provide output 109-1 to flip-flop circuit 110-2. Flip-flop circuit 110-2 may be coupled to receive inverted clock signal 102 and clock signal 103 from clock buffer 111, scan data 104, scan enable signal 105, and inverted scan enable signal 106, input functional data 108, and output 109-1 from flip-flop circuit 110-1. Flip-flop circuit 110-2 may be coupled to provide output 109-2 to a downstream circuit or system, such as another flip-flop circuit of multi-bit flip-flop circuit 100. Clock buffer 111 may be coupled to receive clock signal 101 (e.g., from a timing or clock circuit) and output inverted clock signal 102 and clock signal 103.

Each of the input and output signals, such as clock signal 101, inverted clock signal 102, clock signal 103, scan data 104, scan enable signal 105, inverted scan enable signal 106, input functional data 107, input functional data 108, output 109-1, and output data 109-2 may be electronic logic signals each including a value indicative of a logical low state (i.e., "0") or a logical high state (i.e., "1"). For example, when clock signal 101 is high, inverted clock signal 102 may be low and clock signal 103 may be high. Similarly, when scan enable signal 105 is high, inverted scan enable signal 106 may be low. The state of scan enable signal 105 may be controlled by a controller or another circuit, for example. When scan enable signal 105 is high, multi-bit flip-flop circuit 100 may enter a scan mode whereby components, and nodes thereof, of flip-flop circuits 110-1 and 110-2 may be tested for efficiency and accuracy. When scan enable signal 105 is low, multi-bit flip-flop circuit 100 may enter a data mode whereby multi-bit flip-flop circuit 100 may store state information of input functional data 107 and input functional data 108 for use by systems and digital circuits coupled to multi-bit flip-flop circuit 100.

The logical states of signals within multi-bit flip-flop circuit 100 and operations of multi-bit flip-flop circuit 100 may be based on the logical state of clock signal 103 provided to nodes of multi-bit flip-flop circuit 100 by clock buffer 111. Clock buffer 111 includes transistors 112, 113, 114, and 115. Transistors 112 and 114 may be p-channel (or p-type) metal-oxide semiconductor field-effect transistors (MOSFETs) (also referred to as PMOS), and transistors 113 and 115 may be n-channel (or n-type) MOSFETS (also referred to as NMOS). Each of transistors 112, 113, 114, and 115 may include a drain a source, and a gate. The gates of transistors 112 and 113 may be coupled together and coupled to receive clock signal 101 from a timing or clock circuit. The drains of transistors 112 and 113 may also be coupled together and coupled to the gates of transistors 114 and 115, which may be coupled to receive inverted clock signal 102 from transistors 112 and 113. The sources of transistors 112 and 114 may be coupled to receive a power from an internal power supply (e.g., $V_{dd}$), and the sources of transistors 113 and 115 may be coupled to individual ground nodes. The drains of transistors 114 and 115 may also be coupled together and may be coupled to provide clock signal 103 to nodes of flip-flop circuits 110-1 and 110-2. In effect, transistors 112 and 113 may form a first inverter of clock buffer 111, and transistors 114 and 115 may form a second inverter of clock buffer 111. Accordingly, inverted clock signal 102 and clock signal 103 can be produced by clock buffer 111 and provided to flip-flop circuits 110-1 and 110-2.

Flip-flop circuit 110-1 includes various components coupled to receive signals from clock buffer 111 and coupled to provide outputs to flip-flop circuit 110-2. Specifically, flip-flop circuit 110-1 includes input sub-circuit 120, primary latch sub-circuit 131, latch clock tristate 140, secondary latch sub-circuit 145, and output inverter 155. Input sub-circuit 120 may include a set of inputs coupled to receive inverted clock signal 102 and clock signal 103 from clock buffer 111, scan data 104, scan enable signal 105, and inverted scan enable signal 106 from a controller or another circuit, and input functional data 107 from another circuit. Input sub-circuit 120 may include an output defined by a node between transistor 127 and transistor 128 described below. Primary latch sub-circuit 131 may include an input coupled to the output of input sub-circuit 120 and a set of inputs coupled to clock buffer 111. Primary latch sub-circuit 131 may include an output defined by a node between transistors 138 and 139 and coupled to the gates of transistors 133 and 136 described below. Latch clock tristate 140 may include a set of inputs coupled to the output of primary latch sub-circuit 131 and a set of inputs coupled to clock buffer 111 . . . . Latch clock tristate 140 may include an output defined by a node between transistors 142 and 143 described below. Secondary latch sub-circuit 145 may include a set of inputs coupled to the output of latch clock tristate 140 and a set of inputs coupled to clock buffer 111. Secondary latch sub-circuit 145 may include an output defined by a node between transistors 150 and 151 described below. A set of the inputs of secondary latch sub-circuit 145 may also be coupled to an input of output inverter 155. Output inverter 155 may include an input coupled to the output of latch clock tristate 140 and may include an output defined by a node between transistors 156 and 157 described below.

Input sub-circuit 120 may include transistors 121, 122, 123, 124, 125, 126, 127, 128, 129, and 130, which, together, may form an input scan multiplexer (MUX) and an input clock tristate. Each of the transistors of input sub-circuit 120 may be an NMOS or a PMOS, and each may include a gate, a drain, and a source. In various examples, transistors 121, 122, 123, and 124 may form the input scan MUX, and transistors 125, 126, 127, 128, 129, and 130 may form the input clock tristate. The gates of each of these transistors may be coupled to receive an input signal. The gates of transistors 121 and 124 may be coupled to receive scan data 104, the gates of transistors 122 and 130 may be coupled to receive inverted scan enable signal 106, the gates of transistors 123 and 125 may be coupled to receive scan enable signal 105, the gate of transistor 128 may be coupled to receive inverted clock signal 102, the gate of transistor 127 may be coupled to receive clock signal 103, and the gates of transistors 126 and 129 may be coupled to receive input functional data 107. The source of transistors 121 may be coupled to receive a power from a power supply. The drain of transistor 121 may be coupled to the source of transistor 122, and the drain of transistor 122 may be coupled to the drain of transistor 126 and the source of transistor 127. The source of transistor 124 may be coupled to a ground node, the drain of transistor 124 may be coupled to the source of transistor 123, and the drain of transistor 123 may be coupled to the source of transistor 128 and the drain of transistor 129. The source of transistor 125 may also be coupled to receive a power from the power supply, and the drain of transistor 125 may be coupled to the source of transistor 126. The drain of transistor 126 may be coupled to the source of transistor 127. The drain of transistor 127 may be coupled to the drain of transistor 128, both of which may be further coupled to primary latch sub-circuit 131. The source of transistor 128 may be coupled to the drain of transistor 129. The source of transistor 129 may be coupled to the drain of transistor 130. The source of transistor 130 may be coupled to another ground node.

Primary latch sub-circuit 131 is representative of a first or primary control flip-flop (e.g., a master latch) that can control operations of secondary latch sub-circuit 145, or a second control flip-flop following the first control flip-flop (e.g., a slave latch). Primary latch sub-circuit 131 can store a state value (e.g., "0" or "1") of input functional data 107 or scan data 104 (based on the state of scan enable signal 105) and provide the state value to latch clock tristate 140 for further distribution to secondary latch sub-circuit 145 and output inverter 155. Primary latch sub-circuit 131 can be configured to store a subsequent state value of input functional data 107 or scan data 104 when the state of input functional data 107 or scan data 104 change to a different state relative to its stored state. Following the latching of a new state of the data input, primary latch sub-circuit 131 can provide the new state value to secondary latch sub-circuit 145 via latch clock tristate 140 for storage.

In this example, primary latch sub-circuit 131 includes feedback tristate 132 and inverter 137, which each include a number of NMOS and PMOS transistors. Feedback tristate 132 includes transistors 133, 134, 135, and 136, and inverter 137 includes transistors 138 and 139. Both feedback tristate 132 and inverter 137 are coupled to receive a signal from input sub-circuit 120. Transistor 133 includes a source coupled to receive power from a power supply, a gate coupled to a gate of transistor 136, and a drain coupled to a source of transistor 134. Transistor 134 includes a gate coupled to receive inverted clock signal 102 and a drain coupled to a drain of transistor 135, both of which are further coupled to the drains of transistors 127 and 128. Transistor 125 also includes a gate coupled to receive clock signal 103 and a source coupled to a drain of transistor 136, which also includes a gate coupled to the gate of transistor 133 and a source coupled to a ground node. The gates of transistors 133 and 136 are coupled to latch clock tristate 140 at gates of transistors 141 and 144 of latch clock tristate 140. Transistors 138 and 139 each include gates coupled to the drains of transistors 127 and 128 and to the drains of transistors 134 and 135. Transistor 138 also includes a source coupled to receive power from the power supply and a drain coupled to a drain of transistor 139. The source of transistor 139 is coupled to a ground node. The drains of transistors 138 and 139 are coupled to the gates of transistors 133 and 136, and thus, are also coupled to latch clock tristate 140.

Latch clock tristate 140 includes transistors 141, 142, 143, and 144. Transistors 141 and 142 may be PMOS transistors, while transistors 143 and 144 may be NMOS transistors. Transistor 141 may include a source coupled to receive power from a power supply, a gate coupled to a gate of transistor 144 and further coupled to primary latch sub-circuit 131, and a drain coupled to a source of transistor 142. Transistor 142 may also include a gate coupled to receive inverted clock signal 102 from clock buffer 111 and a drain coupled to a drain of transistor 143, both of which may be coupled to secondary latch sub-circuit 145 and output inverter 155. Transistor 143 may include a gate coupled to receive clock signal 103 from clock buffer 111 and a source coupled to a drain of transistor 144. The source of transistor 144 may be coupled to a ground node.

Secondary latch sub-circuit 145 includes inverter 146, transmission gate 149, and inverter 152, each of which include a number of PMOS and NMOS transistors. Inverter 146 includes transistors 147 and 148, transmission gate 149 includes transistors 150 and 151, and inverter 152 includes transistors 153 and 154. Transistor 147 includes a source coupled to receive a power from a power supply, a gate coupled to a gate of transistor 148, and a drain coupled to a drain of transistor 148. Transistor 148 also includes a source coupled to a ground node. The gates of transistors 147 and 148 are coupled to latch clock tristate 140, transmission gate 149, and to output inverter 155. The drains of transistors 147 and 148 are coupled to gates of transistors 153 and 154 of inverter 152. Transistor 150 includes a gate coupled to receive clock signal 103 from clock buffer 111, a drain coupled to a drain of transistor 151, and a source coupled to a source of transistor 151. Transistor 151 includes a gate coupled to receive inverted clock signal 102 from clock buffer 111. The drains of transistors 150 and 151 are further coupled to latch clock tristate 140, inverter 146, and output inverter 155. The sources are further coupled to input sub-circuit 160 of flip-flop circuit 110-2, or more particularly, to transistors 162 and 163 of scan transmission gate 161 of flip-flop circuit 110-2, and to transistors 153 and 154 of inverter 152. In some examples, the drains of transistors 150 and 151 may instead be coupled to input sub-circuit 160 of flip-flop circuit 110-2. Transistor 153 includes a source coupled to receive power from a power supply, a gate coupled to a gate of transistor 154, and a drain coupled to a drain of transistor 154. Transistor 154 also includes a source coupled to a ground node. The gates of transistors 153 and 154 are coupled to transistors 147 and 148 of inverter 146.

Output inverter 155 includes transistors 156 and 157 coupled to receive signals from latch clock tristate 140 and secondary latch sub-circuit 145 and coupled to provide output 109-1 downstream. Transistor 156 includes a gate coupled to a gate of transistor 157, a source coupled to receive power from a power supply, and a drain coupled to a drain of transistor 157. Transistor 157 also includes a source coupled to a ground node. Output 109-1 can be provided to one or more downstream systems or circuits via the drains of transistors 156 and 157.

Flip-flop circuit 110-2 may be representative of a second bit flip-flop of multi-bit flip-flop circuit 100 that includes various components coupled to receive signals from clock buffer 111 and flip-flop circuit 110-2 and coupled to provide outputs to a further flip-flop sub-circuit. Flip-flop circuit 110-2 may include input sub-circuit 160, primary latch sub-circuit 171, latch clock tristate 180, secondary latch sub-circuit 185, and output inverter 195. Input sub-circuit 160 may include a set of inputs coupled to receive inverted clock signal 102 and clock signal 103 from clock buffer 111, scan data 104, scan enable signal 105, and inverted scan enable signal 106 from a controller or another circuit, and input functional data 108 from another circuit. Input sub-circuit 160 may include an output defined by a node between transistor 167 and transistor 168 described below. Primary latch sub-circuit 171 may include an input coupled to the output of input sub-circuit 160 and a set of inputs coupled to clock buffer 111. Primary latch sub-circuit 171 may include an output defined by a node between transistors 178 and 179 and coupled to the gates of transistors 173 and 176 described below. Latch clock tristate 180 may include an input coupled to the output of primary latch sub-circuit 171 and a set of inputs coupled to clock buffer 111. Latch clock tristate 180 may include an output defined by a node between transistors 182 and 183 described below. Secondary latch sub-circuit 185 may include a set of inputs coupled to the output of latch clock tristate 180 and a set of inputs coupled to clock buffer 111. A set of the inputs of secondary latch sub-circuit 185 may also be coupled to output inverter 195. Secondary latch sub-circuit 185 may include an output defined by a node between transistors 190 and 191 described below. Output inverter 195 may include an input coupled to the output of latch clock tristate 180 and may include an output defined by a node between transistors 196 and 197 described below.

Input sub-circuit 160 may include scan transmission gate 161, which includes transistors 162 and 163, and input clock tristate 164, which includes transistors 165, 166, 167, 168, 169, and 170. Each of the transistors of input sub-circuit 160 may be an NMOS or a PMOS, and each may include a gate, a drain, and a source. The gates of transistors 162 and 170 may be coupled to receive inverted scan enable signal 106, the gates of transistors 163 and 165 may be coupled to receive scan enable signal 105, the gates of transistors 166 and 169 may be coupled to receive input functional data 108, the gate of transistor 167 may be coupled to receive clock signal 103, and the gate of transistor 168 may be coupled to receive inverted clock signal 102. The source of transistor 162 may be coupled to the drain of transistor 166 and to the source of transistor 167. The drain of transistor 162 may be coupled to the drain of transistor 163, both of which may be coupled to receive a signal having the same state as output 109-1 from transmission gate 149 of flip-flop circuit 110-1. The source of transistor 163 may be coupled to the source of transistor 168 and to the drain of transistor 169. The source of transistor 165 may be coupled to receive a power from a power supply, and the drain of transistor 165 may be coupled to the source of transistor 166. The drain of transistor 166 may be coupled to the source of transistor 167. The drain of transistor 167 may be coupled to the drain of transistor 168. The source of transistor 168 may be coupled to the drain of transistor 169. The source of transistor 169 may be coupled to the transistor drain of transistor 170. The source of transistor 170 may be coupled to a ground node. Input sub-circuit 160 may be coupled to primary latch sub-circuit 171 via the drains of transistors 167 and 168.

Primary latch sub-circuit 171 is representative of a first or primary control flip-flop (e.g., a master latch) that can control operations of secondary latch sub-circuit 185, or a second control flip-flop following the first control flip-flop (e.g., a slave latch). Primary latch sub-circuit 171 can store a state value (e.g., "0" or "1") of input functional data 108 or scan data 104 (based on the state of scan enable signal 105) and provide the state value to latch clock tristate 180 for further distribution to secondary latch sub-circuit 185 and output inverter 195. Primary latch sub-circuit 171 can be configured to store a subsequent state value of input functional data 108 or scan data 104 when the state of input functional data 108 or scan data 104 change to a different state relative to its stored state. Following the latching of a new state of the data input, primary latch sub-circuit 171 can provide the new state value to secondary latch sub-circuit 185 via latch clock tristate 180 for storage.

In this example, primary latch sub-circuit 171 includes feedback tristate 172 and inverter 177, which each include a number of NMOS and PMOS transistors. Feedback tristate 172 includes transistors 173, 174, 175, and 176, and inverter 177 includes transistors 178 and 179. Both feedback tristate 172 and inverter 177 are coupled to receive a signal from input sub-circuit 120. Transistor 173 includes a source coupled to receive power from a power supply, a gate coupled to a gate of transistor 176, and a drain coupled to a source of transistor 174. Transistor 174 includes a gate coupled to receive inverted clock signal 102 and a drain coupled to a drain of transistor 175, both of which are further coupled to the drains of transistors 127 and 128. Transistor 125 also includes a gate coupled to receive clock signal 103 and a source coupled to a drain of transistor 176, which also includes a gate coupled to the gate of transistor 173 and a source coupled to a ground node. The gates of transistors 173 and 176 are coupled to latch clock tristate 180 at gates of transistors 181 and 184 of latch clock tristate 180. Transistors 178 and 179 each include gates coupled to the drains of transistors 167 and 168 and to the source of transistor 174 and to the drain of transistor 175. Transistor 178 also includes a source coupled to receive power from the power supply and a drain coupled to a drain of transistor 179. The source of transistor 179 is coupled to a ground node. The drains of transistors 178 and 179 are coupled to the gates of transistors 173 and 176, and thus, are also coupled to latch clock tristate 180.

Latch clock tristate 180 includes transistors 181, 182, 183, and 184. Transistors 181 and 182 may be PMOS transistors, while transistors 183 and 184 may be NMOS transistors. Transistor 181 may include a source coupled to receive power from a power supply, a gate coupled to a gate of transistor 184 and further coupled to primary latch sub-circuit 171, and a drain coupled to a source of transistor 182. Transistor 182 may also include a gate coupled to receive inverted clock signal 102 from clock buffer 111 and a drain coupled to a drain of transistor 183, both of which may be coupled to secondary latch sub-circuit 185 and output inverter 195. Transistor 183 may include a gate coupled to receive clock signal 103 from clock buffer 111 and a source coupled to a drain of transistor 184. The source of transistor 184 may be coupled to a ground node.

Secondary latch sub-circuit 185 includes inverter 186, transmission gate 189, and inverter 192, each of which include a number of PMOS and NMOS transistors. Inverter 186 includes transistors 187 and 188, transmission gate 189 includes transistors 190 and 191, and inverter 192 includes transistors 193 and 194. Transistor 187 includes a source coupled to receive a power from a power supply, a gate coupled to a gate of transistor 188, and a drain coupled to a drain of transistor 188. Transistor 188 also includes a source coupled to a ground node. The gates of transistors 187 and 188 are coupled to latch clock tristate 180, transmission gate 189, and to output inverter 195. The drains of transistors 187 and 188 are coupled to gates of transistors 193 and 194 of inverter 192. Transistor 190 includes a gate coupled to receive clock signal 103 from clock buffer 111, a drain coupled to a drain of transistor 191, and a source coupled to a source of transistor 191. Transistor 191 includes a gate coupled to receive inverted clock signal 102 from clock buffer 111. The drains of transistors 190 and 191 are further coupled to latch clock tristate 180, inverter 186, and output inverter 195. The sources may be further coupled to a further flip-flop circuit (e.g., to another flip-flop bit of multi-bit flip-flop circuit 100) and to transistors 193 and 194 of inverter 192. In some examples, the drains of transistors 190 and 191 may instead be coupled to the further flip-flop circuit. Transistor 193 includes a source coupled to receive power from a power supply, a gate coupled to a gate of transistor 194, and a drain coupled to a drain of transistor 194. Transistor 194 also includes a source coupled to a ground node. The gates of transistors 193 and 194 are coupled to transistors 187 and 188 of inverter 186.

Output inverter 195 includes transistors 196 and 197 coupled to receive signals from latch clock tristate 180 and secondary latch sub-circuit 185 and coupled to provide output 109-2 downstream. Transistor 196 includes a gate coupled to a gate of transistor 197, a source coupled to receive power from a power supply, and a drain coupled to a drain of transistor 197. Transistor 197 also includes a source coupled to a ground node. Output 109-2 can be provided to one or more downstream systems or circuits via the drains of transistors 196 and 197.

In various examples, the topology of multi-bit flip-flop circuit 100 illustrated and described with respect to FIG. 1 may reduce overall power consumption as a single clock buffer (clock buffer 111) may be used for both flip-flop circuits 110-1 and 110-2, cell-level area as multiple flip-flop bits can be stitched together using a shared clock buffer and scan inverter, and design area as reduced numbers of transistors may be used, especially in the secondary latch sub-circuits and in the input sub-circuits, relative to existing multi-bit flip-flop circuit designs.

In some examples, other types of transistors may be used instead or in addition to the NMOS and PMOS transistors shown and described herein. In an example, the primary latch sub-circuits and secondary latch sub-circuits may have different topologies individually and/or with respect to each other. For example, each latch sub-circuit may include a different number of inverters, different types of transistors, or the like.

Figure 2:
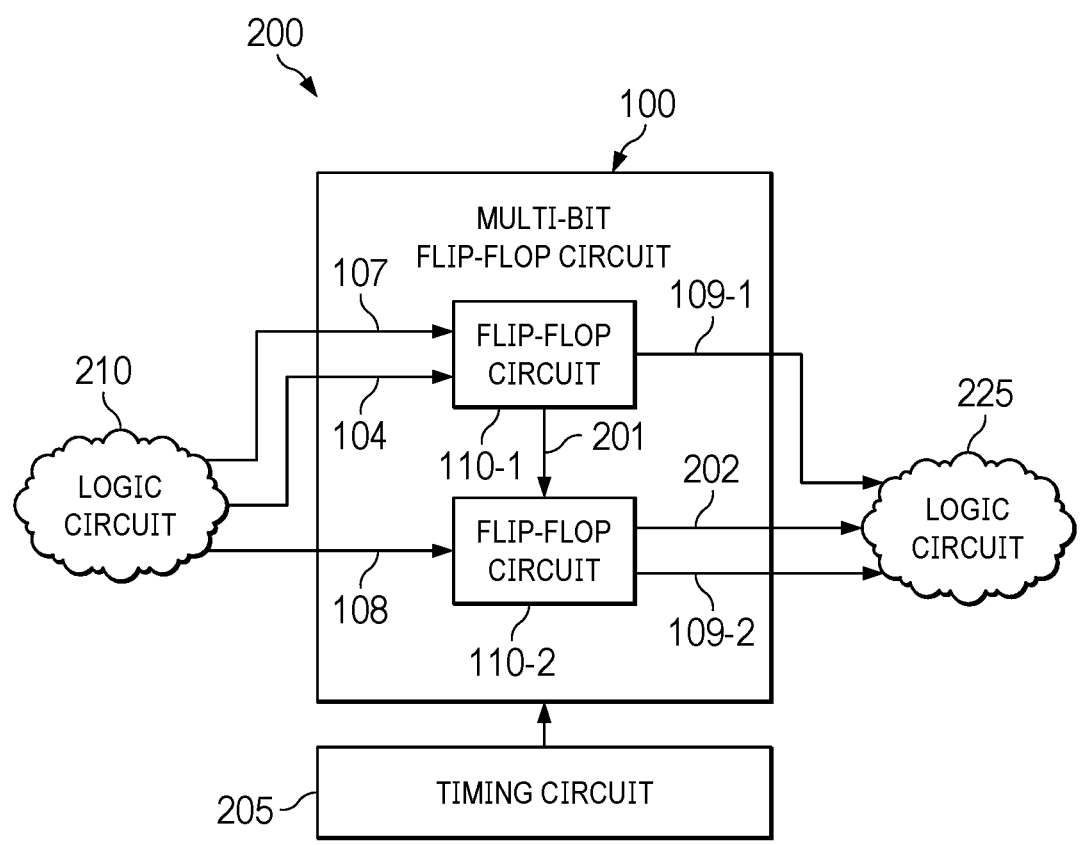
FIG. 2 illustrates an example operating environment for executing logic with a multi-bit flip-flop circuit in accordance with an embodiment.

FIG. 2 illustrates an example operating environment for executing logic with a multi-bit flip-flop circuit in accordance with an embodiment. FIG. 2 shows operating environment 200, which includes timing circuit 205, logic circuit 210, multi-bit flip-flop circuit 100, which includes flip-flop circuit 110-1 and flip-flop circuit 110-2, and logic circuit 225.

Logic circuit 210 is representative of a digital circuit, digital logic device, or combination or variation of electronic and logic elements capable of performing logic steps in accordance with a clock signal, such as one produced by timing circuit 205 (e.g., clock signal 101 of FIG. 1). Logic circuit 210 can produce a data signal, a test signal, a scan signal, or another signal (e.g., scan data 104, scan enable signal 105, input functional data 107, input functional data 108) and provide one or more of the signals to flip-flop circuits 110-1 and 110-2 of multi-bit flip-flop circuit 100. For example, logic circuit 210 can provide input functional data 107 and scan data 104 to flip-flop circuit 110-1 and input functional data 108 to flip-flop circuit 110-2.

Multi-bit flip-flop circuit 100 may be representative of a two-bit flip-flop circuit capable of storing multiple bit-level signals (input functional data 107 and input functional data 108) provided by logic circuit 210 based on a clock signal provided by timing circuit 205 (via a clock signal and/or a scan clock signal) and outputting multiple bit-level signals (outputs 109-1 and 109-2). Each bit of multi-bit flip-flop circuit 100, or flip-flop circuit 110-1 and flip-flop circuit 110-2, may be used to store a state (e.g., "0", "1") of an input signal and provide the stored state data downstream to subsequent bits of multi-bit flip-flop circuit 100 and to other digital circuits, such as logic circuit 225. Accordingly, multi-bit flip-flop circuit 100 may be used to provide power improvements and area reduction, among other benefits, of a digital system.

Flip-flop circuits 110-1 and 110-2 may be representative of bit flip-flops of a multi-bit flip-flop circuit 100 capable of resolving and storing logical states of signals. Each flip-flop circuit of multi-bit flip-flop circuit 100 may include a data path and a scan path for resolving data or testing operations of the circuits, respectively. For example, when storing data, flip-flop circuit 110-1 may be coupled to receive input functional data 107 from logic circuit 210 and provide output 109-1 to logic circuit 225, and flip-flop circuit 110-2 may be coupled to receive input functional data 108 from logic circuit 210 and provide output 109-2 to logic circuit 225. When performing a scan of multi-bit flip-flop circuit 100, flip-flop circuit 110-1 may be coupled to receive scan data 104 from logic circuit 210 and provide scan data output 201 to flip-flop circuit 110-2. Flip-flop circuit 110-2 can then provide scan data output 202 to logic circuit 225. Flip-flop circuits 110-1 and 110-2 may also be configured to receive a clock signal from timing circuit 205 (e.g., a clock buffer of multi-bit flip-flop circuit 100 (e.g., clock buffer 111)). The flip-flop circuits can store values of the electronic signals and provide outputs indicative of the values to subsequent flip-flop circuits and/or to logic circuit 225. In various examples, flip-flop circuits 110-1 and 110-2 may employ various transistors and topologies, such as those described above, to perform such functions.

Logic circuit 225 is also representative of a digital circuit, digital logic device, or combination or variation of electronic and logic elements capable of performing logic steps in accordance with a clock signal, such as the clock signal produced by timing circuit 205.

While some examples provided herein are described in the context of a multi-bit flip-flop circuit, sub-circuit, system, subsystem, component, device, architecture, or environment, it should be understood that the gates, latches, flip-flops, logic elements, and other circuits, systems, and methods described herein are not limited to such embodiments and may apply to a variety of other processes, systems, applications, devices, and the like, such as other circuits, logic devices, latches, transistors, and the like, in the context of increasing transistor resolution efficiency, among other benefits, for example. Accordingly, aspects of the present invention may be embodied as other systems, methods, and other configurable systems.

Unless the context clearly requires otherwise, throughout the description and the claims, the words "comprise," "comprising," and the like are to be construed in an inclusive sense, as opposed to an exclusive or exhaustive sense; that is to say, in the sense of "including, but not limited to." As used herein, the terms "connected," "coupled," or any variant thereof means any connection or coupling, either direct or indirect, between two or more elements; the coupling or connection between the elements can be physical, logical, or a combination thereof. Additionally, the words "herein," "above," "below," and words of similar import, when used in this application, refer to this application as a whole and not to any particular portions of this application. Where the context permits, words in the above Detailed Description using the singular or plural number may also include the plural or singular number respectively. The word "or," in reference to a list of two or more items, covers all of the following interpretations of the word: any of the items in the list, all of the items in the list, and any combination of the items in the list.

The phrases "in some embodiments," "according to some embodiments," "in the embodiments shown," "in other embodiments," and the like generally mean the particular feature, structure, or characteristic following the phrase is included in at least one implementation of the present technology, and may be included in more than one implementation. In addition, such phrases do not necessarily refer to the same embodiments or different embodiments.

The above Detailed Description of examples of the technology is not intended to be exhaustive or to limit the technology to the precise form disclosed above. While specific examples for the technology are described above for illustrative purposes, various equivalent modifications are possible within the scope of the technology, as those skilled in the relevant art will recognize. For example, while processes or blocks are presented in a given order, alternative implementations may perform routines having steps, or employ systems having blocks, in a different order, and some processes or blocks may be deleted, moved, added, subdivided, combined, and/or modified to provide alternative or subcombinations. Each of these processes or blocks may be implemented in a variety of different ways. Also, while processes or blocks are at times shown as being performed in series, these processes or blocks may instead be performed or implemented in parallel or may be performed at different times. Further any specific numbers noted herein are only examples: alternative implementations may employ differing values or ranges.

The teachings of the technology provided herein can be applied to other systems, not necessarily the system described above. The elements and acts of the various examples described above can be combined to provide further implementations of the technology. Some alternative implementations of the technology may include not only additional elements to those implementations noted above, but also may include fewer elements.

These and other changes can be made to the technology in light of the above Detailed Description. While the above description describes certain examples of the technology, and describes the best mode contemplated, no matter how detailed the above appears in text, the technology can be practiced in many ways. Details of the system may vary considerably in its specific implementation, while still being encompassed by the technology disclosed herein. As noted above, particular terminology used when describing certain features or aspects of the technology should not be taken to imply that the terminology is being redefined herein to be restricted to any specific characteristics, features, or aspects of the technology with which that terminology is associated. In general, the terms used in the following claims should not be construed to limit the technology to the specific examples disclosed in the specification, unless the above Detailed Description section explicitly defines such terms. Accordingly, the actual scope of the technology encompasses not only the disclosed examples, but also all equivalent ways of practicing or implementing the technology under the claims.

To reduce the number of claims, certain aspects of the technology are presented below in certain claim forms, but the applicant contemplates the various aspects of the technology in any number of claim forms. For example, while only one aspect of the technology is recited as a computer-readable medium claim, other aspects may likewise be embodied as a computer-readable medium claim, or in other forms, such as being embodied in a means-plus-function claim. Any claims intended to be treated under 35 U.S.C. § 112 (f) will begin with the words "means for" but use of the term "for" in any other context is not intended to invoke treatment under 35 U.S.C. § 112 (f). Accordingly, the applicant reserves the right to pursue additional claims after filing this application to pursue such additional claim forms, in either this application or in a continuing application.

What is claimed is:

1. A circuit device, comprising:
  a first flip-flop sub-circuit coupled to receive a clock signal and an input; and
  a second flip-flop sub-circuit coupled to receive the clock signal and coupled to the first flip-flop sub-circuit;
  wherein the first flip-flop sub-circuit comprises:
    an input sub-circuit coupled to receive the clock signal and the input;
    a first latch sub-circuit coupled to receive the clock signal and coupled to the input sub-circuit;
    a first latch tristate coupled to receive the clock signal and coupled to the first latch sub-circuit;
    a second latch sub-circuit coupled to receive the clock signal and coupled to the first latch tristate; and
    a first output inverter coupled to the first latch tristate and to the second latch sub-circuit;
  wherein the second latch sub-circuit includes:
    a first transmission gate coupled to the first latch tristate, the first output inverter, and the second flip-flop sub-circuit;
    a first inverter coupled to the first transmission gate; and
    a second inverter coupled to the first inverter, the first latch tristate, and the first output inverter; and
  wherein the second flip-flop sub-circuit comprises:
    a second transmission gate coupled to the first transmission gate of the second latch sub-circuit;
    a first clock tristate coupled to receive the clock signal and coupled to the second transmission gate;
    a third latch sub-circuit coupled to receive the clock signal and coupled to the first clock tristate;
    a second latch tristate coupled to receive the clock signal and coupled to the third latch sub-circuit;
    a fourth latch sub-circuit coupled to receive the clock signal and coupled to the second latch tristate; and
    a second output inverter coupled to the second latch tristate and to the fourth latch sub-circuit;
  wherein the fourth latch sub-circuit includes:
    a third transmission gate coupled to the second latch tristate and the second output inverter;
    a third inverter coupled to the third transmission gate; and
    a fourth inverter coupled to the third inverter, the second latch tristate, and the second output inverter.

2. The circuit device of claim 1, wherein the first flip-flop sub-circuit is a first bit flip-flop in a multi-bit flip-flop circuit, and wherein the second flip-flop sub-circuit is a second bit flip-flop in the multi-bit flip-flop circuit.

3. The circuit device of claim 2, wherein the multi-bit flip-flop circuit comprises a plurality of bits.

4. The circuit device of claim 1, wherein the input sub-circuit of the first flip-flop sub-circuit comprises an input scan multiplexer and a second clock tristate, wherein the input scan multiplexer is coupled to receive the input, and wherein the second clock tristate is coupled to the input scan multiplexer and coupled to receive the clock signal.

5. The circuit device of claim 1, wherein the first latch sub-circuit comprises a first feedback tristate and a fifth inverter, wherein the first feedback tristate is coupled to receive the clock signal and coupled to the input sub-circuit, and wherein the fifth inverter is coupled to the input sub-circuit.

6. The circuit device of claim 1, wherein the third latch sub-circuit comprises a second feedback tristate and a sixth inverter, wherein the second feedback tristate is coupled to receive the clock signal and coupled to the first clock tristate, and wherein the sixth inverter is coupled to the first clock tristate.

7. The circuit device of claim 1, wherein the first flip-flop sub-circuit and the second flip sub-circuit comprise a plurality of n-type transistors and a plurality of p-type transistors.

8. A circuit device, comprising:
  a first flip-flop sub-circuit coupled to receive a clock signal and an input; and
  a second flip-flop sub-circuit coupled to receive the clock signal and coupled to the first flip-flop sub-circuit;
  wherein the first flip-flop sub-circuit comprises:
    an input sub-circuit coupled to receive the clock signal and the input;
    a first latch sub-circuit coupled to receive the clock signal and coupled to the input sub-circuit;

a first latch tristate coupled to receive the clock signal and coupled to the first latch sub-circuit;
a second latch sub-circuit coupled to receive the clock signal and coupled to the first latch tristate; and
a first output inverter coupled to the first latch tristate and to the second latch sub-circuit;
wherein the second latch sub-circuit includes:
a first transmission gate coupled to the first latch tristate, the first output inverter, and the second flip-flop sub-circuit;
a first inverter coupled to the first transmission gate; and
a second inverter coupled to the first inverter, the first latch tristate, and the first output inverter.

9. The circuit device of claim 8, wherein the second flip-flop sub-circuit comprises:
a second transmission gate coupled to the first transmission gate of the second latch sub-circuit;
a first clock tristate coupled to receive the clock signal and coupled to the second transmission gate;
a third latch sub-circuit coupled to receive the clock signal and coupled to the second transmission gate;
a second latch tristate coupled to receive the clock signal and coupled to the third latch sub-circuit;
a fourth latch sub-circuit coupled to receive the clock signal and coupled to the second latch tristate; and
a second output inverter coupled to the second latch tristate and to the fourth latch sub-circuit;
wherein the fourth latch sub-circuit includes:
a third transmission gate coupled to the second latch tristate and the second output inverter;
a third inverter coupled to the third transmission gate; and
a fourth inverter coupled to the third inverter, the second latch tristate, and the second output inverter.

10. The circuit device of claim 9, wherein the first flip-flop sub-circuit is a first bit flip-flop in a multi-bit flip-flop circuit, and wherein the second flip-flop sub-circuit is a second bit flip-flop in the multi-bit flip-flop circuit.

11. The circuit device of claim 10, wherein the multi-bit flip-flop circuit comprises a plurality of bits.

12. The circuit device of claim 9, wherein the third latch sub-circuit comprises a second feedback tristate and a sixth inverter, wherein the second feedback tristate is coupled to receive the clock signal and coupled to the first clock tristate, and wherein the sixth inverter is coupled to the first clock tristate.

13. The circuit device of claim 9, wherein the first flip-flop sub-circuit and the second flip sub-circuit comprise a plurality of n-type transistors and a plurality of p-type transistors.

14. The circuit device of claim 8, wherein the input sub-circuit of the first flip-flop sub-circuit comprises an input scan multiplexer and a clock tristate, wherein the input scan multiplexer is coupled to receive the input, and wherein the clock tristate is coupled to the input scan multiplexer and coupled to receive the clock signal.

15. The circuit device of claim 8, wherein the first latch sub-circuit comprises a first feedback tristate and a fifth inverter, wherein the first feedback tristate is coupled to receive the clock signal and coupled to the input sub-circuit, and wherein the fifth inverter is coupled to the input sub-circuit.

16. A circuit device, comprising:
a first flip-flop sub-circuit coupled to receive a clock signal and an input; and
a second flip-flop sub-circuit coupled to receive the clock signal and coupled to the first flip-flop sub-circuit;
wherein the second flip-flop sub-circuit comprises:
a first transmission gate coupled to the first flip-flop sub-circuit;
a first clock tristate coupled to receive the clock signal and coupled to the first transmission gate;
a first latch sub-circuit coupled to receive the clock signal and coupled to the first clock tristate;
a first latch tristate coupled to receive the clock signal and coupled to the first latch sub-circuit;
a second latch sub-circuit coupled to receive the clock signal and coupled to the first latch tristate; and
a first output inverter coupled to the first latch tristate and to the second latch sub-circuit;
wherein the second latch sub-circuit includes:
a second transmission gate coupled to the first latch tristate and the first output inverter;
a first inverter coupled to the second transmission gate; and
a second inverter coupled to the first inverter, the first latch tristate, and the first output inverter.

17. The circuit device of claim 16, wherein the first flip-flop sub-circuit comprises:
an input sub-circuit coupled to receive the clock signal and the input;
a third latch sub-circuit coupled to receive the clock signal and coupled to the input sub-circuit;
a second latch tristate coupled to receive the clock signal and coupled to the third latch sub-circuit;
a fourth latch sub-circuit coupled to receive the clock signal and coupled to the second latch tristate; and
a second output inverter coupled to the second latch tristate and to the fourth latch sub-circuit;
wherein the fourth latch sub-circuit includes:
a third transmission gate coupled to the second latch tristate, the second output inverter, and the second flip-flop sub-circuit;
a third inverter coupled to the third transmission gate; and
a fourth inverter coupled to the third inverter, the second latch tristate, and the second output inverter.

18. The circuit device of claim 17, wherein the first flip-flop sub-circuit is a first bit flip-flop in a multi-bit flip-flop circuit, and wherein the second flip-flop sub-circuit is a second bit flip-flop in the multi-bit flip-flop circuit.

19. The circuit device of claim 17, wherein the input sub-circuit of the first flip-flop sub-circuit comprises an input scan multiplexer and a second clock tristate, wherein the input scan multiplexer is coupled to receive the input, and wherein the second clock tristate is coupled to the input scan multiplexer and coupled to receive the clock signal.

20. The circuit device of claim 19, wherein:
the first latch sub-circuit comprises a first feedback tristate coupled to receive the clock signal and coupled to the input sub-circuit and a fifth inverter coupled to the input sub-circuit; and
the third latch sub-circuit comprises a second feedback tristate coupled to receive the clock signal and coupled to the second clock tristate and a sixth inverter coupled to the second clock tristate.

* * * * *